United States Patent [19]

Nishijima

[11] Patent Number: 5,404,058
[45] Date of Patent: Apr. 4, 1995

[54] LEVEL DETECTING CIRCUIT

[75] Inventor: Kazunori Nishijima, Tokyo, Japan

[73] Assignee: NEC Corporation, Japan

[21] Appl. No.: 281,344

[22] Filed: Jul. 27, 1994

Related U.S. Application Data

[63] Continuation of Ser. No. 127,085, Sep. 24, 1993, which is a continuation of Ser. No. 985,351, Dec. 1, 1992, which is a continuation of Ser. No. 698,821, May 13, 1991, abandoned.

[30] Foreign Application Priority Data

May 17, 1990 [JP] Japan .................................. 2-128057

[51] Int. Cl.$^6$ .......................... G06G 7/10; G06G 7/12; H03F 3/45; H03F 3/04
[52] U.S. Cl. .................... 327/332; 330/256; 330/289; 327/513
[58] Field of Search .................. 307/310, 491, 493; 330/256, 289; 375/76

[56] References Cited

U.S. PATENT DOCUMENTS

| | | | |
|---|---|---|---|
| 3,686,517 | 8/1972 | Sexton, Jr. | 330/289 |
| 3,808,469 | 4/1974 | Raymond et al. | 307/310 |
| 3,912,997 | 10/1975 | Asmar | 318/676 |
| 3,973,147 | 8/1976 | Yu | 307/310 |
| 4,096,382 | 6/1978 | Numata et al. | 307/310 |
| 4,267,468 | 5/1981 | Hilliker | 307/310 |
| 4,424,461 | 1/1984 | Taguchi et al. | 307/310 |
| 4,611,129 | 9/1986 | Ishihara | 307/310 |
| 4,853,646 | 8/1989 | Johnson et al. | 330/289 |

FOREIGN PATENT DOCUMENTS 0169288 1/1986 France .
0084722 3/1983 Japan .

*Primary Examiner*—Curtis Kuntz
*Assistant Examiner*—Sinh Tran
*Attorney, Agent, or Firm*—Laff, Whitesel, Conte & Saret, Ltd.

[57] ABSTRACT

A level detecting circuit includes an operational amplifier, a first resistor, a first series circuit of second and third resistors, a fourth resistor, and a second series circuit of fifth and sixth resistors. The operational amplifier receives differential outputs from an AGC detecting circuit as inverting and non-inverting inputs. The first resistor is connected between one differential output of the AGC detecting circuit and the inverting input of the operational amplifier. The first series circuit is inserted in a negative feedback loop between an output of the operational amplifier and the inverting input of the operational amplifier. The fourth resistor is connected between the other differential output of the AGC detecting circuit and the non-inverting input of the operational amplifier. The second series circuit is connected between a bias voltage and the non-inverting input of the operational amplifier. The resistances of the first and fourth resistors and resistances of the second, third, fifth, and sixth are respectively set to be the same, and a temperature coefficient of each of the first, second, fourth, and fifth resistors and a temperature coefficient of each of the third and sixth resistors are set to have the same absolute value and opposite polarities.

5 Claims, 3 Drawing Sheets

LEVEL DETECTING CIRCUIT

This application is a continuation of application Ser. No. 08/127,085, filed Sep. 24, 1993, which was a continuation of Ser. No. 07/985,351, filed Dec. 1, 1992, which was a continuation of Ser. No. 07/698,821, filed May 13, 1991, abandoned.

BACKGROUND OF THE INVENTION

The present invention relates to a transistor circuit and, more particularly, to a level detecting circuit.

A level detecting circuit is generally designed to indicate the electric field strength of a signal (radio wave) in an FM/AM broadcast receiver, a satellite broadcast receiver, or the like. In general, an output from the level detecting circuit is input to a driving circuit of a signal level meter. As a means for obtaining a level detection output, a means for amplifying an RFAGC detection output from the front end portion of a tuner is available. FIG. 2 shows this means. A conventional level detecting circuit is denoted by reference numeral 15 in FIG. 2, which corresponds to an operational amplifier portion for amplifying a gain control voltage $\Delta V$ of a gain control amplifier 11 of an AGCAMP.

An operation of the circuit in FIG. 2 will be described below. A second AGCAMP is constituted by the gain control amplifier 11, a post-amplifier 12, an AGC detecting circuit 13, and a DC amplifier 14. An input signal to the AGCAMP is input to the base of a transistor Q5 and is amplified by the gain control amplifier 11. The input signal is amplified by the post-amplifier 12 and is subsequently input to the AGC detecting circuit 13 to be amplitude-detected. The AGC detection output is amplified by the DC amplifier 14 and is input to a differential electronic volume control constituted by transistors Q1 to Q4 to be subjected to AGC processing. A level at the start of AGC processing is set by the AGC detecting circuit 13. Assume that a gain of the gain control amplifier 11 is to be obtained. In this case, a mutual conductance $g_m$ of a differential circuit constituted by transistors Q5 and Q6 is represented by the following equation ($v_T$ is the thermal voltage of the transistors):

$$g_m = \frac{1}{\frac{v_T}{I} + 2R_E} \tag{1}$$

If a current I from a constant current source for the differential circuit is temperature-corrected by using a band gap regulator to establish $$I = v_T/a \tag{2}$$

then, equation (1) is rewritten as follows:

$$g_m = \frac{1}{a + 2R_E} \tag{3}$$

Therefore, a collector current $I_{C5}$ of the transistor Q5 is given by the following equation, provided that an input signal to the AGCAMP is represented by $v_i$:

$$I_{C5} = v_i g_m + \frac{I}{2} \tag{4}$$

In a differential circuit constituted by the transistors Q1 and Q2, if the base voltages of the transistors Q1 and Q2 are represented by $V_{B1}$ and $V_{B2}$, a voltage $\Delta V$ between the bases of the transistors Q1 and Q2 is given by $$\Delta V = V_{B2} - V_{B1} \tag{5}$$

According to equations (5) and (4), a collector current $I_{C1}$ of the transistor Q1 is given by $$I_{C1} = \frac{e^{-\frac{\Delta v}{vT}} I_{C5}}{1 + e^{-\frac{\Delta v}{vT}}} = \frac{I_{C5}}{I + e^{+\frac{\Delta V}{vT}}} \tag{6}$$

A substitution of equation (5) into equation (6) yields $$I_{C1} = \frac{1}{I + e^{+\frac{\Delta V}{vT}}} \left( v_i g_m + \frac{I}{2} \right) \tag{7}$$

$$I_{C2} = \frac{g_m}{I + e^{+\frac{\Delta V}{vT}}} v_i + \frac{I}{2(1 + e^{+\frac{\Delta V}{vT}})}$$

Therefore, a collector voltage $V_{C1}$ of the transistor Q1 is represented by equation (8):

$$V_{C1} = R_L I_{C2} = \frac{R_L g_m}{I + e^{+\frac{\Delta V}{vT}}} v_i + \frac{R_L I}{2(1 + e^{+\frac{\Delta V}{vT}})} \tag{8}$$

An AC signal component $v_{C1}$ of the collector voltage $V_{C1}$ is represented by $$v_{C1} = \frac{R_L g_m}{I + e^{+\frac{\Delta V}{vT}}} v_i \tag{9}$$

That is, the input signal to the post-amplifier 12 becomes the AC signal component $v_{C1}$, and an output $v_O$ from the AGCAMP is given by the following equation, provided that the gain of the post-amplifier 12 is represented by $A_{PO}$:

$$v_o = A_{PO} \cdot v_{C1} = \frac{A_{PO} R_L g_m}{I + e^{+\frac{\Delta V}{vT}}} v_i \tag{10}$$

If the AGCAMP is now performing an AGC operation, it can be assumed that an output from the AGCAMP is constant, and $v_O = V_{OC}$ (11). At this time, the relationship between the input signal and the value $\Delta V$ given by $$V_o = \frac{A_{PO} R_L g_m}{I + e^{+\frac{\Delta V}{vT}}} v_i \tag{11}$$

Equation (11) is solved with respect to $\Delta V$ as follows:

$$1 + e^{+\frac{\Delta V}{vT}} = \frac{v_1}{V_o} A_{PO} R_L g_m \tag{12}$$

$$e^{+\frac{\Delta V}{vT}} = \frac{A_{PO} R_L g_m}{V_o} v_i - 1$$

-continued $$\frac{\Delta V}{v_T} = +\log\left(\frac{A_{PO}R_L g_m}{V_o}v_i - 1\right)$$

$$\Delta V = +v_T \log\left(\frac{A_{PO}R_L g_m}{V_o}v_i - 1\right)$$

Equation (12) indicates the relationship between the input signal level $v_i$ and the difference in voltage between the transistors Q1 and Q2 in an AGCAMP operation. Referring to FIG. 2, the value $\Delta V$ corresponds to an AGC detection output obtained through the DC amplifier 14. In generally, the value $\Delta V$ is further amplified by an operational amplifier to obtain a level detection output. If the value $\Delta V$ is amplified by the operational amplifier 15 in FIG. 2, a level detection output $L_O$ is given by $$L_o = \frac{R_2}{R_1}\Delta V + V_B \quad (13)$$

$$= \frac{R_2}{R_1}v_T\log\left(\frac{A_{PO}R_L g_m}{V_o}v_i - 1\right) + V_B$$

If equation (3) is substituted into equation (13), the level detection output $L_O$ is represented by $$L_o = \frac{R_2}{R_1}v_T\log\left\{\frac{A_{PO}R_L}{V_o(\alpha + 2R_E)}v_i - 1\right\} + V_B \quad (14)$$

In this conventional level detecting circuit, as indicated by equation (14):

$$L_o = \frac{R_2}{R_1}v_T\log\left\{\frac{A_{PO}R_L}{V_o(\alpha + 2R_E)}v_i - 1\right\} + V_B \quad (14)$$

since the level detection output $L_O$ includes the term of a thermal voltage, the value $L_O$ varies in relation to temperatures. For example, when a temperature $t = -25°$ C., a level detection output $L_1$ is given by $$L_1 = \quad (15)$$

$$\frac{R_2}{R_1} \cdot \frac{k(273 - 25)}{q} \cdot \log\left\{\frac{A_{PO}R_L}{V_o(\alpha + 2R_E)}v_i - 1\right\} + V_B$$

When the temperature $t = 75°$ C., a level detection output $L_2$ is given by $$L_2 = \quad (16)$$

$$\frac{R_2}{R_1} \cdot \frac{k(273 + 75)}{q} \cdot \log\left\{\frac{A_{PO}R_L}{V_o(\alpha + 2R_E)}v_i - 1\right\} + V_B$$

(where $A_{PO}$, $V_O$, $v_i$, and $V_B$ are constant with respect to temperatures.)

A ratio of $L_2$ to $L_1$ is given by $$\frac{L_2}{L_1} = \frac{273 + 75}{273 - 25} \approx 1.40 \quad (17)$$

That is, the level detection output varies at 40% in the temperature range of $-25°$ C. to $75°$ C. The level detection output similarly varies with changes in the input signal $v_i$. Since the level detection output always varies with signal changes from a low-level input to a high-level input, some kind of temperature correction is required in a level meter driving circuit to which the level detection output is input. Otherwise, the level meter varies with temperature changes.

SUMMARY OF THE INVENTION

It is an object of the present invention to provide a level detecting circuit which can suppress variations in output level with changes in temperatures.

It is another object of the present invention to provide a level detecting circuit which requires no temperature correction in a subsequent circuit to which a level detection output is input.

In order to achieve the above objects, according to the present invention, there is provided a level detecting circuit comprising an operational amplifier for receiving differential outputs from an AGC detecting circuit as inverting and non-inverting inputs, a first resistor connected between one differential output of the AGC detecting circuit and the inverting input of the operational amplifier, a series circuit of second and third resistors inserted in a negative feedback loop between an output of the operational amplifier and the inverting input of the operational amplifier, a fourth resistor connected between the other differential output of the AGC detecting circuit and the non-inverting input of the operational amplifier, and a series circuit of fifth and sixth resistors connected between a bias voltage and the non-inverting input of the operational amplifier, wherein resistances of the first and fourth resistors and resistances of the second, third, fifth, and sixth are respectively set to be the same, and a temperature coefficient of each of the first, second, fourth, and fifth resistors and a temperature coefficient of each of the third and sixth resistors are set to have the same absolute value and opposite polarities.

DESCRIPTION OF THE PREFERRED EMBODIMENTS

Figure 1:
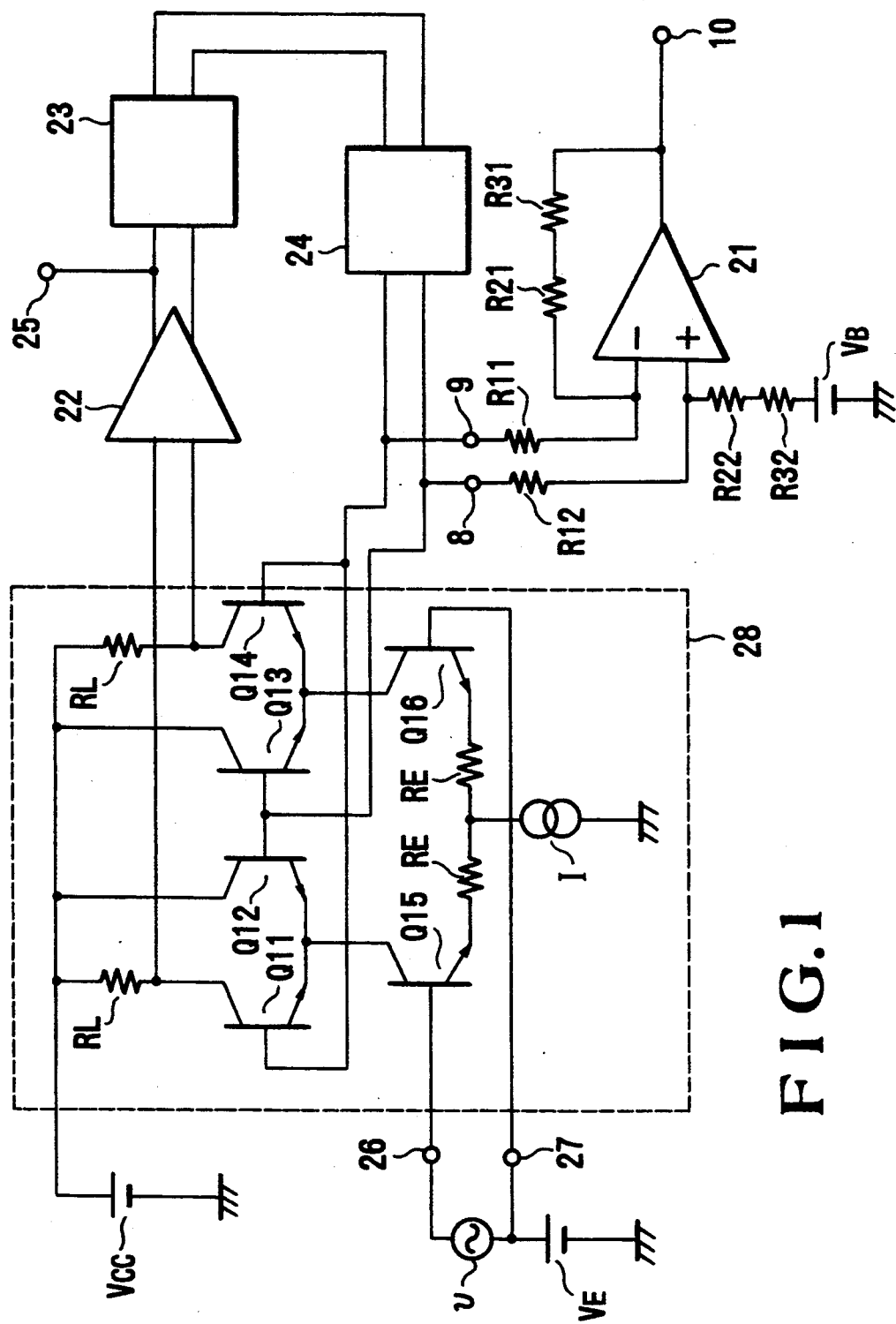
FIG. 1 is a block diagram showing an overall AGCAMP including an embodiment of the present invention.
Figure 2:
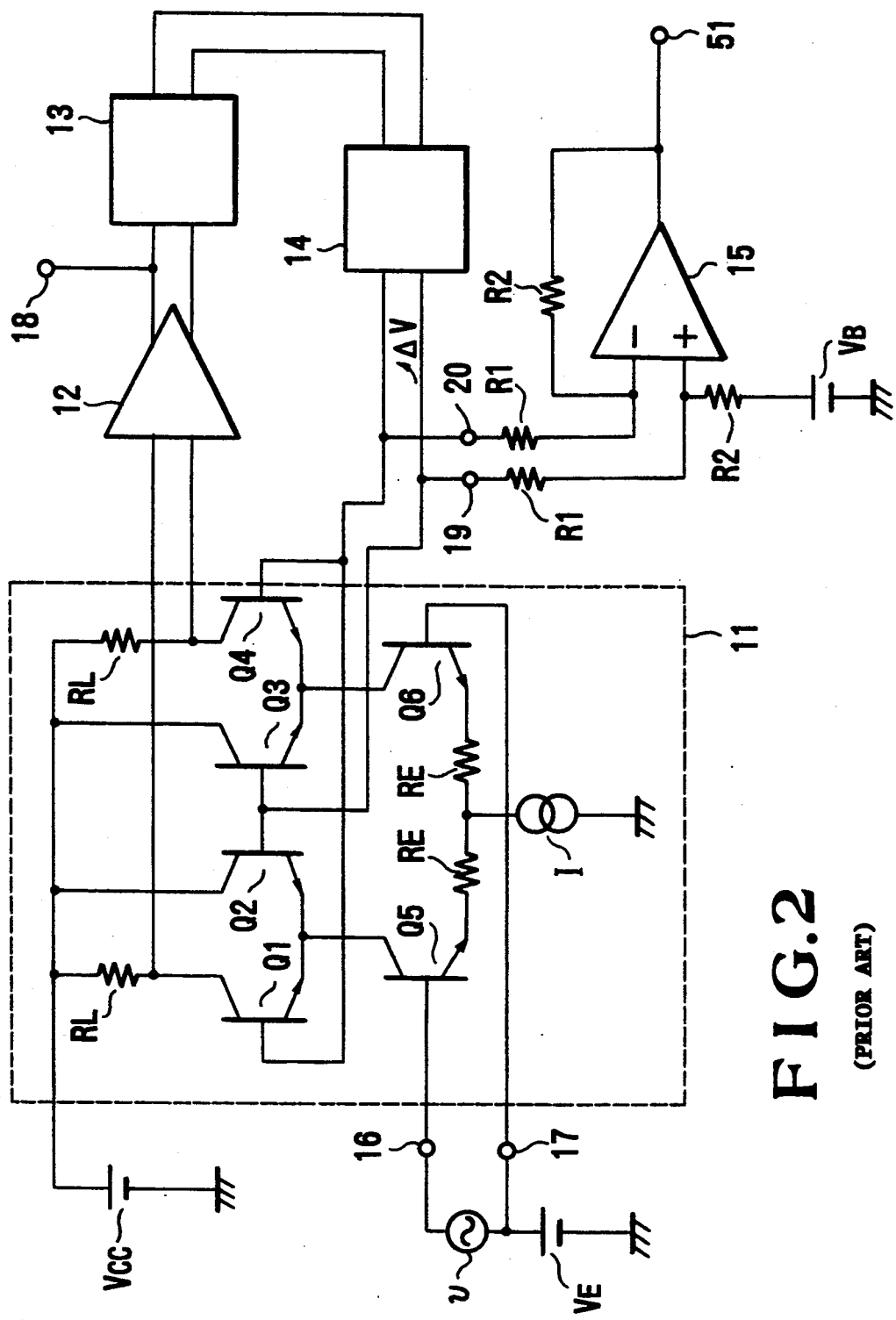
FIG. 2 is a block diagram showing an overall AGCAMP including a conventional level detecting circuit.

The present invention will be described below with reference to the accompanying drawings. FIG. 1 shows a level detecting circuit according to an embodiment of the present invention. Referring to FIG. 1, reference symbols R11, R12, R21, R22, R31, and R32 denote resistors. Reference numeral 21 denotes an operational amplifier; 22, a post-amplifier; 23, an AGC detecting circuit; 24, a DC amplifier; and 28, a gain control amplifier. AGC detection outputs (from the DC amplifier) input to input terminals 8 and 9 are amplified by the operational amplifier 21, and a level detection output is output from an output terminal 10. An operation of this circuit will be described below. The resistors R11, R12, R21, and R22 have the same temperature coefficient.

Each of the resistors R31 and R32 has a temperature coefficient having the same absolute value as that of the temperature coefficient of each of the resistors R11, R12, R21, and R22 but having a polarity opposite thereto. If the absolute value of the temperature coefficient of each of the resistors R11, R12, R21, R22, R31, and R32 is represented by $\alpha$, resistors R1 (R11, R12), R2 (R21, R22), and R3 (R31, R32) can be expressed as follows:

$$R1 = R_{10}(\alpha t + 1) \quad (18)$$

$$R2 = R_{20}(\alpha t + 1) \quad (19)$$

$$R3 = R_{30}(-\alpha t + 1) \quad (20)$$

Assume that the values of the resistors R2 and R3 are the same at the temperature $t=0$, and $R_{20} = R_{30}$. In this case, $$R_3 = R_{20}(-\alpha t + 1) \quad (21)$$

A gain $G_O$ of the operational amplifier 21 is then obtained as follows:

$$G_O = \frac{R2 + R3}{R1} = \frac{R_{20}(\alpha t + 1) + R_{20}(-\alpha t + 1)}{R_{10}(\alpha t + 1)} \quad (22)$$

$$= \frac{2R_{20}}{R_{10}(\alpha t + 1)}$$

According to equation (12), the AGC detection output $\Delta V$ obtained through the DC amplifier is given by $$\Delta V = v_T \log\left(\frac{A_{PO} R_L g_m}{V_O} v_i - 1\right) \quad (23)$$

Therefore, the level detection output $L_{O1}$ is obtained by $$L_{O1} = G_O \Delta V + V_B \quad (24)$$

$$= \frac{2R_{20}}{R_{10}(\alpha t + 1)} v_T \log\left(\frac{A_{PO} R_L g_m}{V_O} v_i - 1\right)$$

$$= \frac{2R_{20}}{R_{10}(\alpha t + 1)} \cdot \frac{k(t + 273)}{q} \cdot \left(\frac{A_{PO} R_L g_m}{V_O} v_i - 1\right)$$

As has been described above, according to the present invention, two resistors having the same resistance and the temperature coefficients with the same absolute value and opposite polarities are used as feedback resistors of the operational amplifier. Therefore, the level detection output $L_O$ is given by $$L_O = \frac{2R_{20}}{R_{10}(\alpha t + 1)} \cdot \frac{k(t + 273)}{q} \cdot \log\left(\frac{A_{PO} R_L g_m}{V_O} v_i - 1\right) \quad (25)$$

If the temperature coefficient of each of the resistors R1 and R2 is $+2500$ ppm, and the temperature coefficient of the resistor R3 is $-2500$ ppm, since $\alpha$ is the absolute value of a temperature coefficient, $$\alpha = 1000 \times 10^{-6} = 0.0025 \quad (26)$$

Therefore, the level detection output $L_O$ is represented by $$L_O = \frac{800 R_{20}}{R_{10}(t + 400)} \cdot \frac{k(t + 273)}{q} \cdot \log\left(\frac{A_{PO} R_L g_m}{V_O} v_i - 1\right) \quad (27)$$

The value $g_m$ of equation (3) is substituted into equation (27) to obtain $$L_O = \frac{800 R_{20}}{R_{10}(t + 500)} \cdot \frac{k(t + 273)}{q} \cdot \quad (28)$$

$$\log\left\{\frac{A_{PO} R_L}{(\alpha + 2R_E) V_O} v_i - 1\right\}$$

At $t = -25°$ C., the level detection output $L_1$ is given by $$L_1 = \frac{2R_{20}}{R_{10}(-25 + 400)} \cdot \frac{k(-25 + 273)}{q} \cdot \quad (29)$$

$$\log\left\{\frac{A_{PO} R_L}{V_O(\alpha + 2R_E)} v_i - 1\right\}$$

At $t = 75°$ C. the level detection output $L_2$ is given by $$L_2 = \frac{2R_{20}}{R_{20}(75 + 400)} \cdot \frac{k(75 + 273)}{q} \cdot \quad (30)$$

$$\log\left\{\frac{A_{PO} R_L}{V_O(\alpha + 2R_E)} v_i - 1\right\}$$

(Note that the values $A_{PO}$ and $v_i$ do not vary with changes in temperature.)

A ratio of $L_2$ to $L_1$ is obtained as follows:

$$\frac{L_2}{L_1} = \frac{\frac{75 + 273}{475}}{\frac{-25 + 273}{375}} \approx 1.11 \quad (31)$$

That is, the variations in level detection output can be suppressed to be 11% through the temperature range of $-25°$ C. to $+75°$ C. In comparison with the conventional circuit, the variations in level detection output with changes in temperature are reduced by about 30%.

Figure 3:
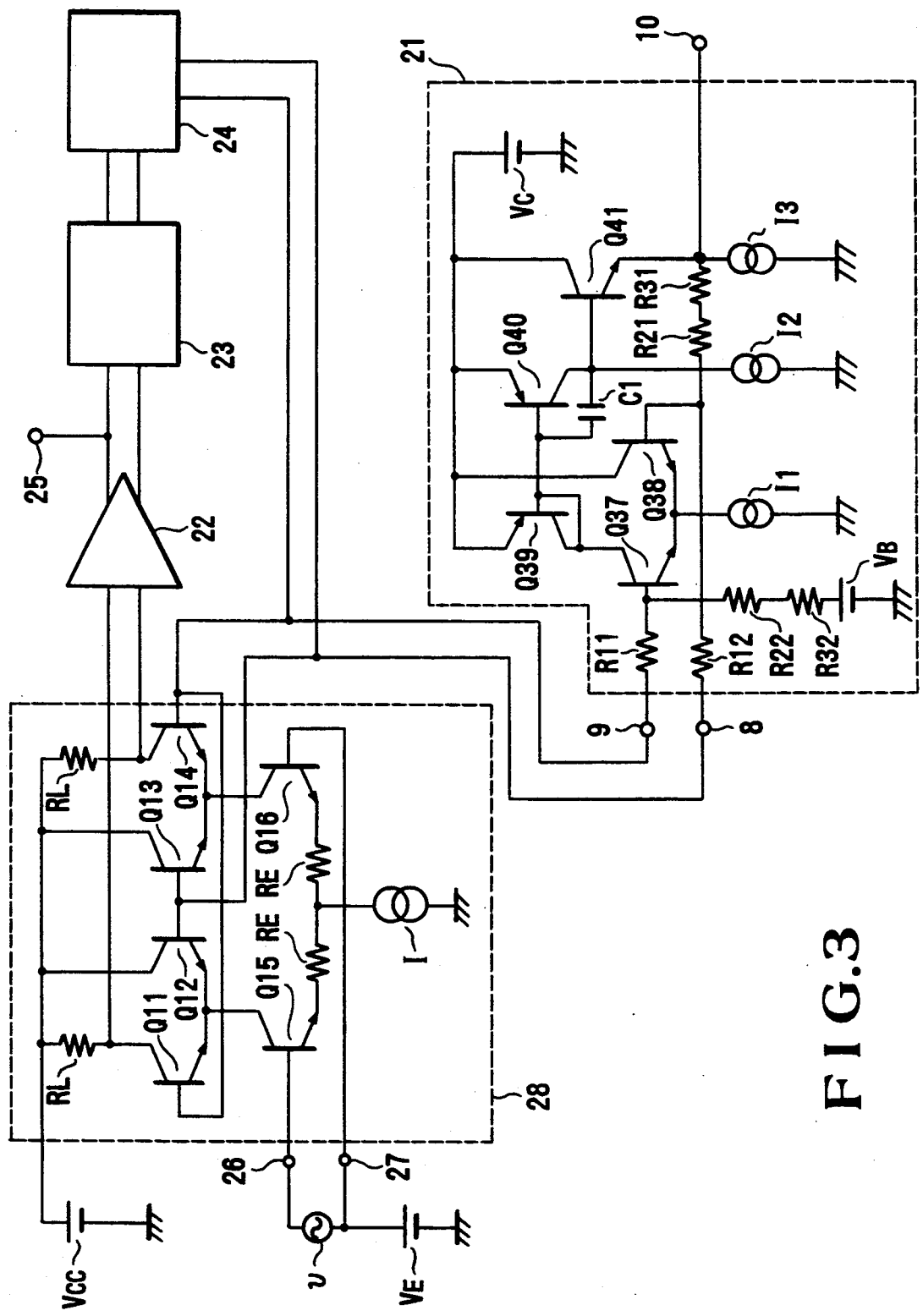
FIG. 3 is a block diagram showing an overall AGCAMP including another embodiment of the present invention.

FIG. 3 shows a circuit according to the second embodiment of the present invention, which is a practical example of the level detection circuit 21 in FIG. 1. Referring to FIG. 3, resistors R12 and R11 are respectively connected between input terminals 8 and 9 and the bases of transistors Q38 and Q37. A series circuit consisting of resistors R22 and R32 is connected between the base of the transistor Q37 and a power supply VB. A series circuit consisting of resistors R21 and R31 is connected between the base of the transistor Q38 and the emitter of a transistor Q41. The emitter of the transistor Q37 is grounded through a constant current element I1, and the collector of the transistor Q37 is connected to the base and collector of a transistor Q39. The emitter and collector of the transistor Q38 are respectively connected to the emitter of the transistor Q37 and a power supply VC. The emitter of the transistor Q39 is connected to the power supply VC. The base of a transistor Q40 is connected to the base of the transistor Q39, and the collector of the transistor Q40 is grounded through a constant current element I2. The emitter of the transistor Q40 is connected to the power supply VC. A phase compensation capacitor C1 is connected between the base and collector of the transistor Q40. The base, collector, and emitter of the transistor Q41 are respectively connected to the collector of the transistor Q40, the power supply VC, and a constant current element I3. The node between the emitter of the transistor Q41 and the element I3 is connected to an output terminal 10.

In this arrangement, the same effect as described above can be obtained with the resistors R11, R12, R21, R22, R31, and R32 having the same relationship as that of the resistors in FIG. 1.

What is claimed is:

1. A level detecting circuit comprising first and second input terminals supplied with an input signal voltage therebetween, said input signal voltage having a temperature dependency in which a voltage level of said input signal voltage is changed in accordance with a temperature change, an operational amplifier having a first input node, a second input node and an output node, a first resistor connected between said first input terminal and said first input node of said operational amplifier and having a first temperature coefficient of a first polarity, a second resistor connected between said second input terminal and said second input node of said operational amplifier and having a second temperature coefficient of said first polarity, third and fourth resistors connected in series between said first input node and said output node of said operational amplifier, said third resistor having a third temperature coefficient of said first polarity and said fourth resistor having a fourth temperature coefficient of a second polarity opposite to said first polarity, a bias voltage source applying a bias voltage at a bias node, and fifth and sixth resistors connected in series between said second input node of said operational amplifier and said bias node of said bias voltage source, said fifth resistor having a fifth temperature coefficient of said first polarity and said sixth resistor having a sixth temperature coefficient of said second polarity, wherein said operational amplifier produces at said output node an output signal voltage relative to said input signal voltage with a compensation for said temperature dependency of said input signal voltage and said operational amplifier having a total gain which is positively affected in accordance with the temperature change of the input signal voltage.

2. The circuit as claimed in claim 1, wherein said first, second, third, fourth, fifth and sixth temperature coefficients are equal in absolute value to one another.

3. The circuit as claimed in claim 2, wherein each of said first and second resistors has a first resistance value and each of said third, fourth, fifth and sixth resistors has a second resistance value.

4. The circuit as claimed in claim 3, wherein said input signal voltage has said temperature dependency based on a thermal voltage of a transistor.

5. A circuit comprising first and second input terminals supplied with an input signal voltage therebetween, said input signal voltage being changed dependently on a variation of a temperature, an operational amplifier having an inverting input node, a non-inverting input node and an output node, a first resistor connected between said first input terminal and said inverting input node of said operational amplifier and having a first resistance value and a first temperature coefficient of a first polarity, a second resistor connected between said second input terminal and said non-inverting input node of said operational amplifier and having a second resistance value and a second temperature coefficient of said first polarity, said first and second resistance values being equal to each other, third and fourth resistors connected in series between said inverting input node and said output node of said operational amplifier, said third resistor having a third resistance value and a third temperature coefficient of said first polarity, said fourth resistor having a fourth resistance value and a fourth temperature of a second polarity opposite to said first polarity, a bias voltage source applying a bias voltage at a bias node, and fifth and sixth resistors connected in series between said non-inverting input node of said operational amplifier and said bias node of said bias voltage source, said fifth resistor having a fifth resistance value and a fifth temperature coefficient of said first polarity, said sixth resistor having a sixth resistance value and a sixth temperature coefficient of said second polarity, said third, fourth, fifth and sixth resistance values being equal to one another, and said first, second, third, fourth, fifth and sixth temperature coefficients being equal in absolute value to one another, wherein said operational amplifier produces at said output node an output signal voltage having a voltage level which is compensated against said variation of temperature and said operational amplifier having a total gain which is positively affected in accordance with the temperature variation of the input signal voltage.

* * * * *